(12) United States Patent
Pfirsch et al.

(10) Patent No.: US 9,231,581 B2
(45) Date of Patent: Jan. 5, 2016

(54) METHOD OF OPERATING A REVERSE CONDUCTING IGBT

(71) Applicant: Infineon Technologies AG, Neubiberg (DE)

(72) Inventors: Frank Pfirsch, Munich (DE); Dorothea Werber, Munich (DE); Anton Mauder, Kolbermoor (DE); Carsten Schaeffer, Annenheim (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/551,632

(22) Filed: Nov. 24, 2014

(65) Prior Publication Data

US 2015/0109050 A1 Apr. 23, 2015

Related U.S. Application Data

(63) Continuation of application No. 13/529,166, filed on Jun. 21, 2012, now abandoned.

(51) Int. Cl.
*H01L 29/66* (2006.01)
*H01L 29/739* (2006.01)
*H03K 17/66* (2006.01)
*H01L 29/40* (2006.01)
(Continued)

(52) U.S. Cl.
CPC ............ *H03K 17/66* (2013.01); *H01L 29/0619* (2013.01); *H01L 29/0696* (2013.01); *H01L 29/0834* (2013.01); *H01L 29/404* (2013.01); *H01L 29/407* (2013.01); *H01L 29/7393* (2013.01); *H01L 29/7395* (2013.01); *H01L 29/7397* (2013.01); *H03K 3/01* (2013.01)

(58) Field of Classification Search
CPC .................................................. H01L 29/7395
USPC ........................................................ 257/139
See application file for complete search history.

(56) References Cited

U.S. PATENT DOCUMENTS 4,855,799 A * 8/1989 Tanabe et al. ................. 257/341
5,360,984 A * 11/1994 Kirihata ....................... 257/143
(Continued)

FOREIGN PATENT DOCUMENTS

CN 101165916 A 4/2008
DE 102009055322 A1 8/2010
(Continued)

OTHER PUBLICATIONS

Rahimo, et al., "A High Current 3300V Module Employing Reverse Conducting IGBTs Setting a New Benchmark in Output Power Capability", Proceedings of the 20th International Symposium on Power Semiconductor Devices & ICs, May 18-22, 2008. Orlando, FL, pp. 283-286.
(Continued)

*Primary Examiner* — Andy Huynh
*Assistant Examiner* — Sitaramarao S Yechuri
(74) *Attorney, Agent, or Firm* — Murphy, Bilak & Homiller, PLLC

(57) ABSTRACT

According to an embodiment of a method, a semiconductor device is operated in a reverse biased unipolar mode before operating the semiconductor device in an off-state in a forward biased mode. The semiconductor device includes at least one floating parasitic region disposed outside a cell region of the device.

22 Claims, 6 Drawing Sheets

(51) Int. Cl.
- *H01L 29/06* (2006.01)
- *H01L 29/08* (2006.01)
- *H03K 3/01* (2006.01)

(56) References Cited

U.S. PATENT DOCUMENTS

| | | | |
|---|---|---|---|
| 5,430,314 A * | 7/1995 | Yilmaz | 257/328 |
| 5,512,777 A * | 4/1996 | Endo | 257/617 |
| 5,702,961 A * | 12/1997 | Park | 438/138 |
| 8,030,702 B2 * | 10/2011 | Hsieh | 257/330 |
| 2004/0043565 A1 * | 3/2004 | Yamaguchi et al. | 438/268 |
| 2007/0109822 A1 * | 5/2007 | Kuan | 363/21.14 |
| 2007/0138542 A1 * | 6/2007 | Schmidt | 257/328 |
| 2008/0001217 A1 * | 1/2008 | Kawashima | 257/330 |
| 2008/0087912 A1 | 4/2008 | Kaneko | |
| 2008/0179671 A1 * | 7/2008 | Saito et al. | 257/341 |
| 2008/0315297 A1 * | 12/2008 | Takashita et al. | 257/328 |
| 2009/0052230 A1 * | 2/2009 | Rajendran et al. | 365/163 |
| 2010/0289059 A1 * | 11/2010 | Hsieh | 257/140 |
| 2011/0147880 A1 * | 6/2011 | Matthias et al. | 257/504 |
| 2011/0244638 A1 * | 10/2011 | Kikuchi et al. | 438/138 |
| 2011/0250728 A1 * | 10/2011 | Yamashita et al. | 438/378 |

FOREIGN PATENT DOCUMENTS

| | | |
|---|---|---|
| DE | 102010001215 A1 | 11/2010 |
| JP | 2010186805 A | 8/2010 |

OTHER PUBLICATIONS

Rahimo, et al., "The Bi-mode Insulated Gate Transistor (BIGT) a Potential Technology for Higher Power Applications", Proceedings of the 20th International Symposium on Power Semiconductor Devices & ICs, May 18-22, 2008. Orlando, FL, pp. 68-71.

* cited by examiner

METHOD OF OPERATING A REVERSE CONDUCTING IGBT

TECHNICAL FIELD

Embodiments of the present invention relate to an IGBT (Insulated Gate Bipolar Transistor), and in particular to a reverse conducting IGBT (RC-IGBT).

BACKGROUND

An RC-IGBT includes a gate terminal, a collector terminal (drain terminal), and an emitter terminal (source terminal). An RC-IGBT can be operated in a forward biased mode, which is when an internal pn-junction between a body region and a drift region of the RC-IGBT is reverse biased, and in a reverse biased mode, which is when the pn-junction is forward biased. In the forward biased mode, the RC-IGBT only conducts a current when a suitable drive potential is applied to the gate terminal, while in the reverse biased mode, the RC-IGBT conducts a current independent of the control of the gate terminal. In the reverse biased mode, the RC-IGBT operates like a diode that may cause reverse-recovery losses when the RC-IGBT switches from the reverse biased mode, which is when the body diode is conducting, to the forward-biased mode, which is when the body diode is reverse biased. It is basically desirable to reduce those reverse recovery losses.

SUMMARY

A first embodiment relates to a semiconductor device. The semiconductor device includes a first emitter region of a first conductivity type, a second emitter region of a second conductivity type complementary to the first conductivity type, and a drift region of the second conductivity type arranged in a semiconductor body. The semiconductor device further includes a first electrode, wherein the first emitter region and the second emitter region are arranged between the drift region and the first electrode and are each connected to the first electrode. A cell region includes at least one device cell, the at least one device cell includes a body region of the first conductivity type adjoining the drift region, a source region of the second conductivity type adjoining the body region, and a gate electrode adjacent the body region and dielectrically insulated from the body region by a gate dielectric. A second electrode is electrically connected to the source region and the body region of the at least one device cell. The semiconductor device further includes at least one first parasitic region of the first conductivity type arranged outside the cell region, wherein the at least one first parasitic region is floating.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed Description, reference is made to the accompanying drawings, which form a part thereof, and in which are shown by way of illustration specific embodiments in which the invention may be practiced.

Figure 1:
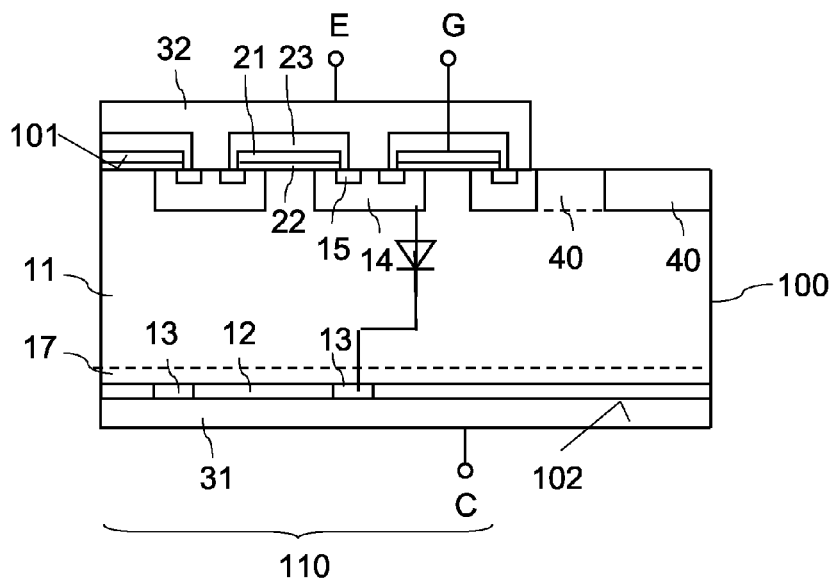
FIG. 1 illustrates a vertical cross sectional view of a semiconductor device including first and second emitter regions, a drift region, device cells and at least one parasitic device region according to a first embodiment.

FIG. 1 illustrates a vertical cross sectional view of a semiconductor device, in particular of a semiconductor device including an IGBT (Insulated Gate Bipolar Transistor). The semiconductor device includes a semiconductor body 100 with a first surface 101 and a second surface 102 opposite the first surface 101. The semiconductor body 100 may include a conventional semiconductor material, such as silicon (Si), gallium arsenide (GaAs), or the like. FIG. 1 illustrates a cross section in a vertical plane of the semiconductor body 100, which is a plane perpendicular to the first and second surfaces 101, 102.

Referring to FIG. 1, the semiconductor device includes a first emitter region 12 of a first conductivity type and at least one second emitter region 13 of a second conductivity type complementary to the first conductivity type. The first and second emitter regions 12, 13 are each electrically connected to a first electrode 31. The first electrode 31 forms a collector terminal (drain terminal) C of the semiconductor device (the IGBT) or is electrically connected to such a collector terminal C. The semiconductor device further includes a drift region 11 of the second conductivity type. The drift region 11 is spaced apart from the first electrode 31 by the first and second emitter regions 12, 13 which are each located between the drift region 11 and the first electrode 31. The drift region 11 may adjoin the first and second emitter regions 12, 13 (as illustrated). Optionally, a field-stop region 17 (illustrated in dashed lines) of the second conductivity type and more highly doped than the drift region 11 is arranged between the drift region 11 and the first and second emitter regions 12, 13. The doping concentration of the drift region 11 is, for example, between $10^{12}$ (1E12) cm$^{-3}$ and $10^{14}$ (1E14) cm$^{-3}$. The doping concentrations of the first and second emitter regions 12, 13 are, for example, between $10^{16}$ (1E16) cm$^{-3}$ and $10^{21}$ (1 E21) cm$^{-3}$.

Referring to FIG. 1, the semiconductor device further includes a cell region 110 with at least one device cell or transistor cell. In the embodiment illustrated in FIG. 1 the cell region 110 includes a plurality of device cells. Each device cell includes a body region 14 of the first conductivity type and a source region 15 of the second conductivity type. The body region 14 adjoins the drift region 11 so that a pn-junction is formed between the body region 14 and the drift region 11. The source region 15 is spaced apart from the drift region 11 by the body region 14. Each device cell further includes a gate electrode 21 adjacent the body region 14 and dielectrically insulated from the body region 14 by a gate dielectric 22. The gate electrode 21 extends from the source region 15 to a section of the drift region 11 along the body region 14 so that the gate electrode 21 is capable of controlling a conducting channel in the body region 14 between the source region 15 and the drift region 11 along the gate dielectric 22. The source regions 15 and the body regions 14 of the individual device cells are electrically connected to a second electrode 32. The second electrode 32 is dielectrically insulated from the gate electrode 21 by an insulating material 23, and forms an emitter terminal (source terminal) E of the semiconductor device (the IGBT) or is electrically connected to the emitter terminal E. The gate electrodes 21 of the individual device cells are electrically connected to a gate terminal G (only schematically illustrated in FIG. 1).

In the embodiment of FIG. 1, the gate electrodes 21 of the individual device cells are planar electrodes located above the first surface 101. According to one embodiment, the individual device cells share one planar gate electrode that has openings in which the second electrode 32 is electrically connected to the source and body regions 14, 15 of the individual device cells.

The first and second emitter regions 12, 13, the drift region 11 and the device cells with the body regions 14, the source regions 15 and the gate electrodes 21 form an IGBT, in particular a reverse conducting (RC) IGBT (RC-IGBT). The basic operating principle of the RC-IGBT is explained in the following. For explanation purposes it is assumed that the semiconductor regions of the first conductivity type, such as the first emitter region 12 and the body regions 14, are p-type semiconductor regions, while the semiconductor regions of the second conductivity type, such as the second emitter region 13, the drift region 11 and the source regions 15, are n-type semiconductor regions. However, this is only an example. According to a further embodiment, the semiconductor regions of the first conductivity type are n-type semiconductor regions and the semiconductor regions of the second conductivity type are p-type semiconductor regions.

The RC-IGBT can be operated in a forward biased mode (forward biased state) and in a reverse biased mode (reverse biased state). The RC-IGBT is in the forward biased state when a voltage is applied between the collector and the emitter terminals C, E that reverse biases the pn-junction between the body region 14 and the drift region 11. This voltage is a positive voltage when the drift region 11 is an n-type region and the body region 14 is a p-type region. In the forward biased mode, the RC-IGBT can be switched on and off by applying a suitable drive potential to the gate terminal G. The RC-IGBT is switched on when the drive potential applied to the gate terminal G causes an inversion channel in the body region 14 between the source region 15 and the drift region 11. In the on-state the first emitter region 12 injects p-type charge carriers (holes) into the drift region 11 and the source regions 15 inject n-type charge carriers (electrons) via the conducting channel in the body region 14 into the drift region 11. These charge carriers injected into the drift region 11 form a charge carrier plasma resulting in a low on-resistance of the RC-IGBT.

When the RC-IGBT is forward biased and the conducting channel in the body region 14 is interrupted, the RC-IGBT is in the off-state. In the off-state, the voltage applied between the collector and emitter terminals C, E causes a depletion region (space charge region) to expand in the drift region 11 starting at the pn-junction between the drift region 11 and the body regions 15 of the individual device cells. The voltage blocking capability of the RC-IGBT is the maximum voltage the RC-IGBT is capable to sustain before an avalanche breakdown occurs. The voltage blocking capability is, inter alia, dependent on the doping concentration of the drift region 11 and the length of the drift region 11, which is the shortest distance between the body regions 14 and the first and second emitter regions 12, 13 or the field stop region 17, respectively.

In the reverse biased mode, a voltage applied between the collector and the emitter terminals C, E forward biases the pn-junction between the body region 14 and the drift region 11. In this operation mode, the body regions 14, the drift region 11 and the second emitter regions 13 form a diode that conducts a current even when the channel in the body region 14 between the source region 15 and the drift region 11 is interrupted. The circuit symbol of this diode is schematically illustrated in FIG. 1. This diode will be referred to as body diode or reverse diode in the following.

The RC-IGBT of FIG. 1 can be used as an electronic switch that is capable of switching on and switching off a current flowing in a first direction when the RC-IGBT is forward biased, while the RC-IGBT always conducts a current flowing in a second direction opposite to the first direction when the RC-IGBT is reverse biased. There is a wide range of circuit applications in which it is desirable to employ a semiconductor switch having this capability.

In the reverse operation mode of the RC-IGBT, p-type charge carriers (holes) are injected into the drift region 11 by the body regions 14, while n-type charge carriers (electrons) are injected into the drift region 11 by the second emitter region 13. These charge carriers form a charge carrier plasma in the drift region 11. When the RC-IGBT switches from the reverse biased mode to the off-state in the forward biased mode, this charge carrier plasma has to be removed from the drift region 11 before the RC-IGBT blocks. In other words, the RC-IGBT may conduct a current after it has been forward biased until the charge carrier plasma has been removed from the drift region 11. The process of removing the charge carrier plasma from the drift region 11 of the RC-IGBT is commonly known as reverse recovery. Losses that may occur in this process are known as reverse recovery losses.

The reverse recovery losses occurring in the cell region 110 of the RC-IGBT can be reduced by driving the gate terminal G such that a conducting channel is generated in the body region 14 between the source region 15 and the drift region 11 before the RC-IGBT is forward biased. As soon as the conducting channel is opened, electrons can bypass the body regions 14 and therefore the injection of holes into the drift region 11 is reduced. Thus, the concentration of stored charge carriers in the drift region 11 is reduced. In this way, the RC-IGBT in the reverse biased mode switches from a bipolar operation mode, in which electrons and holes are injected into the drift region 11, to an operation mode in which only a low concentration of holes is injected into the drift region 11 or even to an operation mode, in which only electrons are injected into the drift region 11 These operation modes, in which only a low concentration of holes is injected or in which only electrons are injected, will be referred to as "unipolar mode" or "reverse biased unipolar mode" in the following. Just before the RC-IGBT switches from the reverse biased unipolar operation mode to the off-state in the forward biased mode, the gate terminal G is driven such that the conducting channel is interrupted in order to prevent a short circuit when, e.g., the RC-IGBT is used in a half-bridge configuration. When switching from the reverse biased unipolar mode to the off-state much fewer charge carriers have to be removed from the drift region 11 before the semiconductor device blocks than in the case when the RC-IGBT would switch from the reverse biased bipolar operation mode to the off-state. Thus, reverse recovery losses are reduced when the semiconductor device is operated such that it switches from the reverse biased unipolar operation mode to the off-state.

Besides the body regions 14 connected to the second electrode 32, the semiconductor device may include at least one semiconductor device region 40 that is floating. This semiconductor region 40 is none of the active device regions, in particular none of the body regions, and will be referred to as "parasitic region" in the following. There may be several reasons to provide such a parasitic region 40, wherein some of these reasons will be explained with reference to examples herein below.

The drift region 11 has a length in a current flow direction. The "current flow direction" is the direction in which charge carriers flow through the drift region 11 when the semiconductor device is in an on-state. In the semiconductor device of FIG. 1, the current flow direction corresponds to the vertical direction of the semiconductor body 100. According to one embodiment, the second emitter region 13 is distant to the at least one parasitic region 40 in a direction perpendicular to the current flow direction, which is a lateral direction of the semiconductor body 100 in the present embodiment. According to one embodiment, the distance is at least one times the length of the drift region 11, 1.5 times the length of the drift region 11, 2 times the length of the drift region 11, or more.

Figure 2:
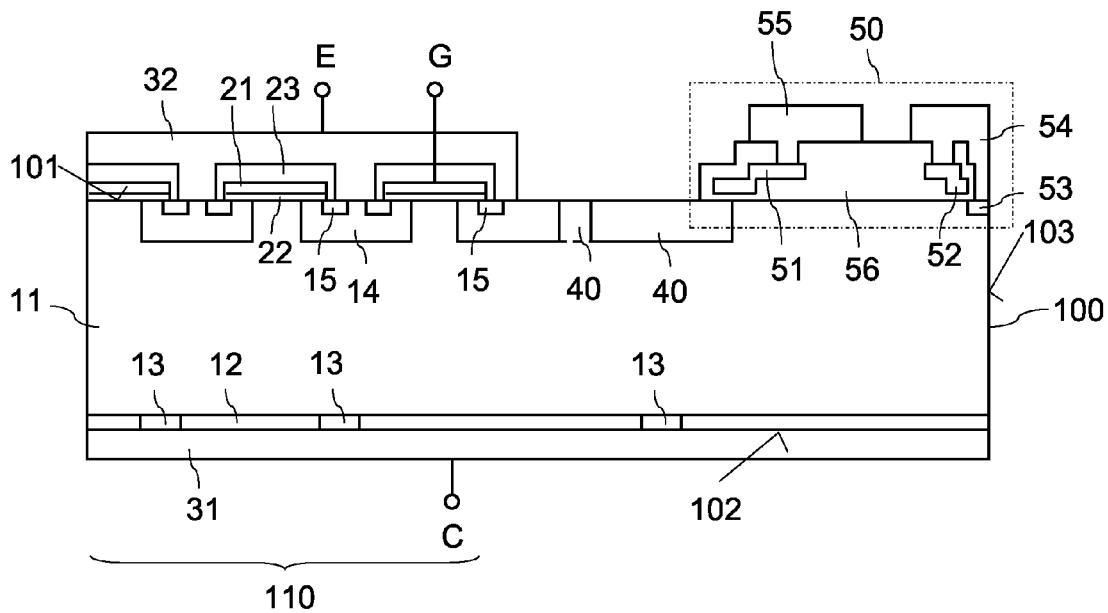
FIG. 2 illustrates a vertical cross sectional view of a semiconductor device according to a second embodiment.
Figure 3:
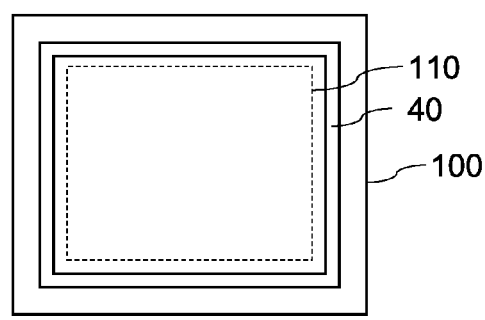
FIG. 3 illustrates a horizontal cross sectional view of the semiconductor device of FIG. 2.

FIG. 2 illustrates a vertical cross sectional view of an RC-IGBT having a topology as explained with reference to FIG. 1. In the RC-IGBT of FIG. 2, the parasitic region 40 is part of an edge termination structure. Referring to FIG. 3, that illustrates a horizontal cross sectional view of the RC-IGBT of FIG. 2, the parasitic region 40 can be ring-shaped and surround the cell region 110 (that is only schematically illustrated in FIG. 2). Referring to FIG. 2, the edge termination structure may additionally include a field-plate arrangement 50 with at least one field-plate. In the embodiment of FIG. 2, the field-plate arrangement 50 includes a first field plate 51 above the first surface 101 and dielectrically insulated from the semiconductor body 100 by an insulation layer 56, and electrically connected to a terminal 55 for a reference potential. The terminal 55 for the reference potential may be either connected to the emitter (source) terminal E or to the gate terminal G. However, those connections are not illustrated in FIG. 2. The field-electrode arrangement 50 of FIG. 2 further includes a second field electrode 52 that is electrically connected to the semiconductor body 100 close to an edge 103 of the semiconductor body 100. The edge 103 terminates the semiconductor body in the horizontal direction. The second field electrode 52 is closer to the edge 103 than the first field electrode 51 and is electrically connected to the semiconductor body 100 through an electrical contact 54. In the embodiment of FIG. 2, the electrical contact 54 is connected to a contact region 53 adjoining the first surface 101. The contact region 53 is a semiconductor region of either the first conductivity type or the second conductivity type and has a higher doping concentration than the drift region 11. Like the parasitic region 40, the field-electrode arrangement 50, that is not illustrated in FIG. 3, may be ring-shaped and surround the cell region 110 with the individual transistor cells.

Figure 5:
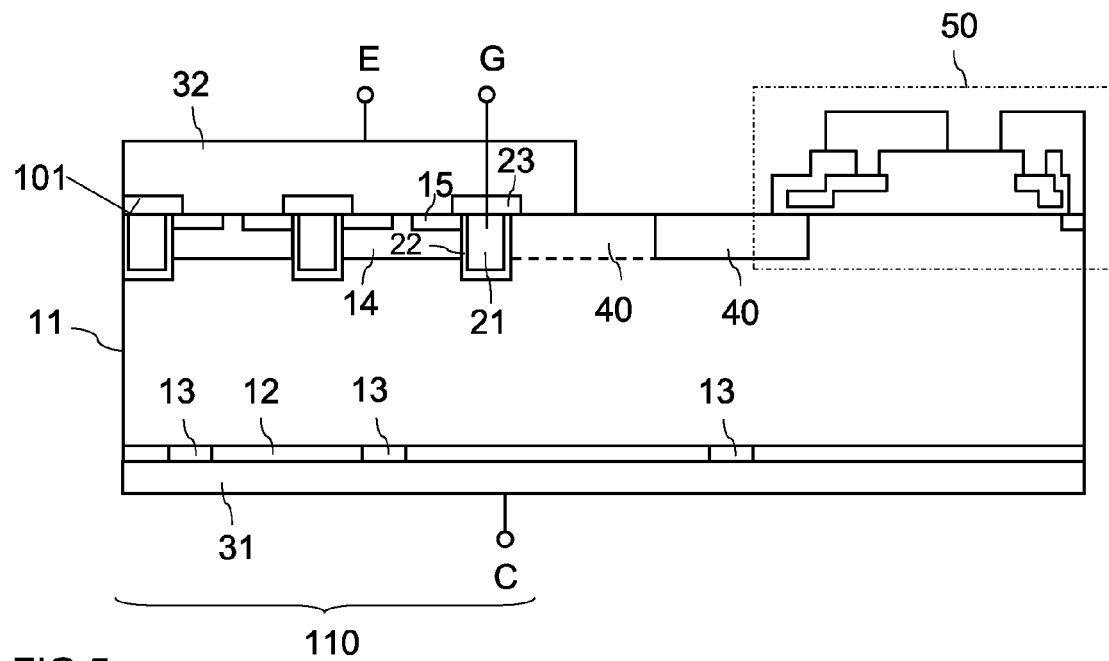
FIG. 5 illustrates a vertical cross sectional view of a semiconductor device according to a third embodiment.
Figure 9:
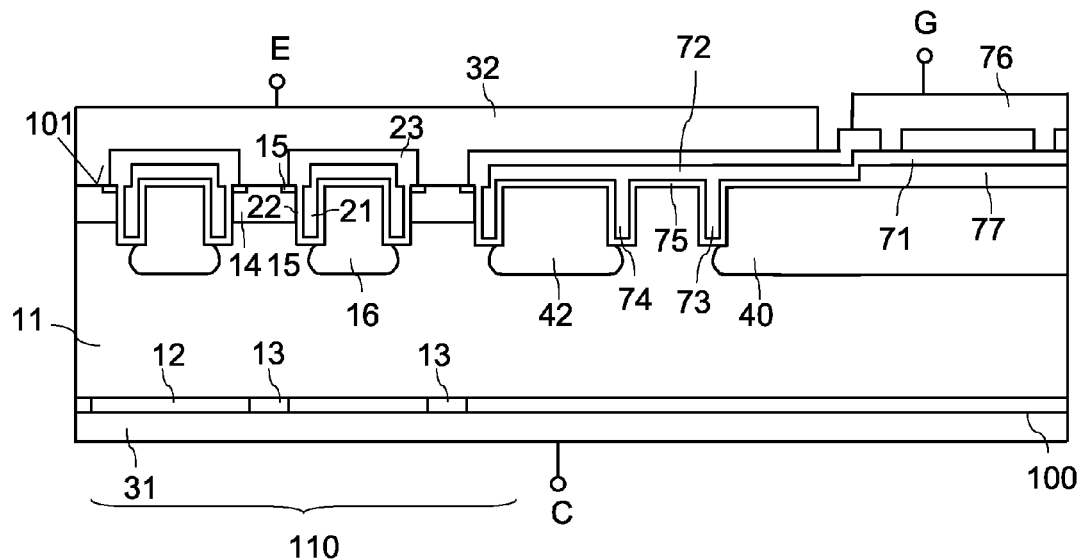
FIG. 9 illustrates a vertical cross sectional view of a semiconductor device according to a fifth embodiment.

Instead of a field-plate arrangement illustrated, e.g., in FIGS. 5 and 9 the edge termination structure may include other well-known edge termination structures (not shown).

Figure 4:
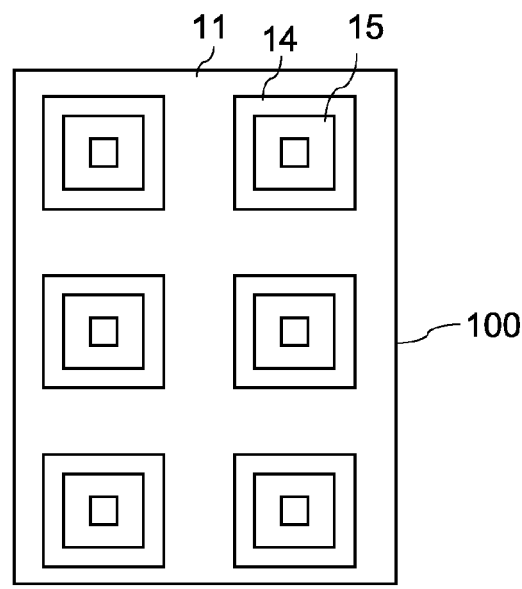
FIG. 4 illustrates a horizontal cross sectional view of a cell region of the semiconductor device of FIG. 2.

The geometry (shape) of the individual transistor cells is mainly defined by the shape of the body region 14. According to one embodiment, the individual transistor cells are rectangular transistor cells with the body regions 14 having a rectangular shape in the horizontal plane. FIG. 4 illustrates a horizontal cross sectional view of an embodiment of the RC-IGBT of FIG. 2 having rectangular transistor cells. In the cross section of FIG. 4, a section of the cell region 110 is illustrated. Referring to FIG. 4, the individual body regions 14 may be rectangular regions. However, this is only an example. According to a further embodiment (not illustrated) the body regions 14 are hexagonal regions, elliptical regions, circular regions, or elongated regions.

Implementing parasitic device regions of the first doping type as floating regions is not limited to RC-IGBTs with a planar gate electrode 21 as explained with reference to FIGS. 1 and 2. FIG. 5 illustrates a vertical cross sectional view of an RC-IGBT according to a further embodiment. In this embodiment, the gate electrode 21 is a trench electrode and is arranged in a trench extending from the first surface 101 into the semiconductor body 100. In the horizontal plane, the gate electrode 21 may have the shape of a rectangular or hexagonal grid, so that the body regions 14 are rectangular or hexagonal semiconductor regions, accordingly.

Figure 6:
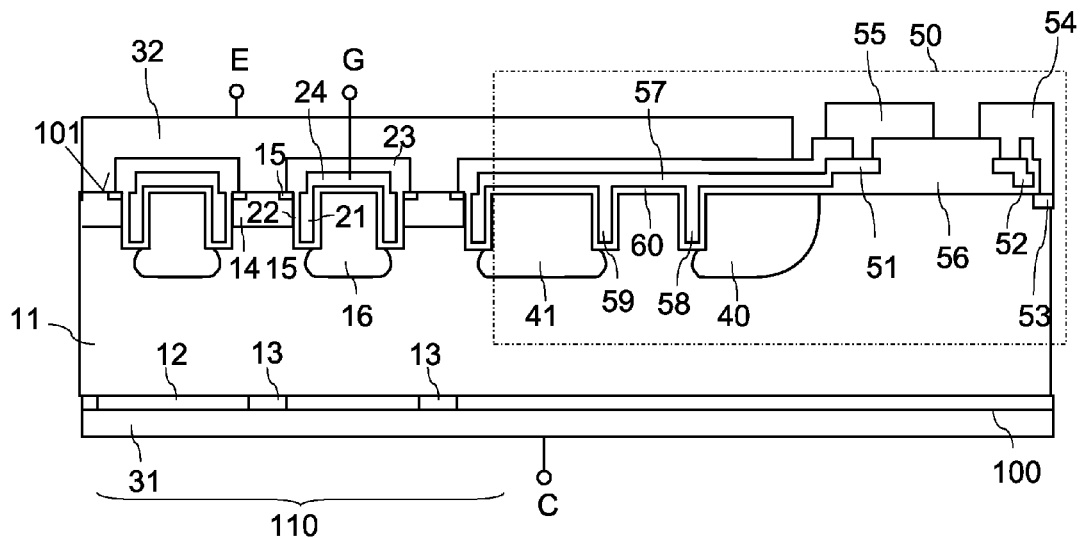
FIG. 6 illustrates a vertical cross sectional view of a semiconductor device according to a fourth embodiment.
Figure 7:
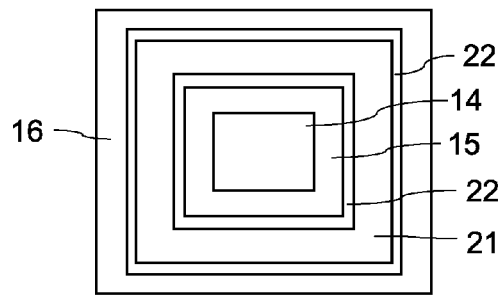
FIG. 7 illustrates a horizontal cross sectional view of one device of the semiconductor device of FIG. 6.

FIG. 6 illustrates a vertical cross sectional view of an RC-IGBT according to a further embodiment. The RC-IGBT includes a cell region 110 with a plurality of device cells (transistor cells) connected in parallel. FIG. 7 illustrates a horizontal cross sectional view of one device cell of the semiconductor device of FIG. 6.

Referring to FIGS. 6 and 7, the gate electrode 21 includes a plurality of ring-shaped trench electrode sections, wherein each trench electrode section surrounds the body region 14 of one transistor cell. In the embodiment illustrated in FIG. 7 the ring-shaped gate electrode section 21 has a rectangular shape. However, this is only an example, these sections could also be hexagonal, circular, elliptical, or the like. Between the gate electrode sections 21 of the individual transistor cells floating semiconductor regions 16 of the first conductivity type are arranged. These floating regions 16 may together form a grid shaped region of the first conductivity type in which the individual device cells are "embedded". The gate electrode sections 21 of neighboring transistor cells are electrically connected through conductors 24 arranged above the first surface 101 of the semiconductor body 100.

In the semiconductor device of FIG. 6, the parasitic device region 40 is again part of an edge termination structure 50. The first field plate 51 of this edge termination structure 50 is electrically connected to the gate electrode sections 21 or the conductors 24 of the individual transistor cells through a planar conductor 57 arranged above the first surface 101 of the semiconductor body 100.

Figure 8:
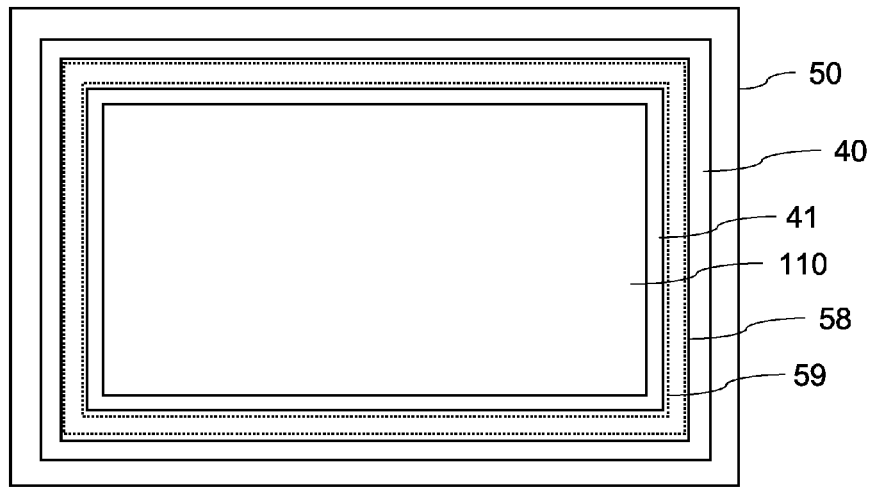
FIG. 8 illustrates a horizontal cross sectional view of a semiconductor device according to one embodiment.

Referring to FIG. 8, which illustrates a horizontal cross sectional view of the semiconductor device of FIG. 6, the edge termination structure 50 may surround the cell region 110 with the individual transistor cells (which is only schematically illustrated in FIG. 8).

Referring to FIG. 6, the edge termination structure 50 may include a further parasitic device region 41 of the first doping type. This further parasitic device region 41 is spaced apart from the parasitic device region 40 in the horizontal direction of the semiconductor body 100 and is located between the parasitic device region 40 and the cell region 110. In the following, the parasitic device region 40 will be referred to as "first parasitic device region", and the further parasitic device region 41 will be referred to as "second parasitic device region". The first and second parasitic device regions 40, 41 may adjoin the first surface 101. Referring to FIG. 8, the first and second parasitic device region 40, 41 may be ring-shaped and surround the cell region 110 in the horizontal plane. Between the first and second parasitic regions 40, 41 there may be a section of the drift region 11 extending to the first surface 101 of the semiconductor body 100.

Referring to FIG. 6, the edge termination structure 50 may further include first and second trench electrodes 58, 59 which are each electrically connected to the planar conductor 57. The first and second trench electrodes 58, 59 are arranged in trenches extending from the first surface 101 into the semiconductor body 100. These first and second trench electrodes 58, 59 are distant in the lateral direction of the semiconductor body 100. Further, referring to FIG. 8, the first and second trench electrodes 58, 59 (illustrated in dotted lines in FIG. 8) may surround the cell region 110 similar to the first and second parasitic device regions 40, 41. Each of the first and second trench electrodes 58, 59 is dielectrically insulated from the semiconductor body 100 by a dielectric layer 60 which also insulates the planar conductor 57 from the semiconductor body 100.

The depths of the first and second trench electrodes 58, 59 may correspond to the depths of the gate electrodes 21 of the individual transistor cells. In the semiconductor device of FIG. 6, the first parasitic region 40 adjoins the trench with the first trench electrode 58 and the dielectric layer 60, while the second parasitic region 41 adjoins the trench with the second trench electrode 59 and the corresponding dielectric layer. The second parasitic region 41 further adjoins a trench with the gate electrode 21 of an edge transistor cell. The "edge transistor cell" is a transistor cell at the edge of the cell region 110. Between the first and second trench electrodes 58, 59 a section of the drift region 11 extends to the first surface 101 of the semiconductor body 100.

According to one embodiment, the second parasitic device region 41 is electrically connected to the floating regions 16 in the cell region 110. However, such electrical connection is not explicitly illustrated in FIG. 6.

FIG. 9 illustrates a vertical cross sectional view of a semiconductor device according to a further embodiment. The semiconductor device of FIG. 9 is different from the semiconductor device of FIG. 6 in that the first parasitic region 40 is located in the semiconductor body 100 below a gate pad or gate via 71. The gate pad or gate via 71 is arranged above the first surface 101 of the semiconductor body and is distant to the cell region 110 in a lateral direction of the semiconductor body 100. A gate terminal electrode 76 may be electrically connected to the gate pad or gate via 71. The gate terminal electrode 76 is connected to a gate terminal G of the semiconductor device or forms that gate terminal.

The gate pad or gate via 71 is electrically connected to the gate electrode sections 21 of the individual transistor cells through a planar conductor 72 arranged above the first surface 101 of the semiconductor body 100 and dielectrically insulated from the semiconductor body 100 by a dielectric layer 77. Like in the embodiment explained with reference to FIGS. 6 and 8, the first parasitic region 40 may surround the cell region 110 in the horizontal plane of the semiconductor body 100. Further, the semiconductor device may include a second parasitic device region 42 corresponding to the second parasitic device region 41 explained with reference to FIG. 6. First and second trench electrodes 73, 74 are connected to the planar conductor 72. These first and second trench electrodes 73, 74 may correspond to the first and second trench electrodes 58, 59 explained with reference to FIG. 6, so that everything that has been explained with reference to these trench electrodes 58, 59 applies to the trench electrodes 73, 74 of FIG. 9 accordingly.

Referring to FIG. 9, the gate pad or gate via 71 is dielectrically insulated from the semiconductor body 100 by a dielectric layer 77. This dielectric layer 77 may be thicker than the dielectric layer 75 insulating the planar conductor 72 from the semiconductor body 100. In other words, the planar conductor 72 may be arranged closer to the first surface 101 of the semiconductor body 100 than the gate pad or gate via 71.

Figure 10:
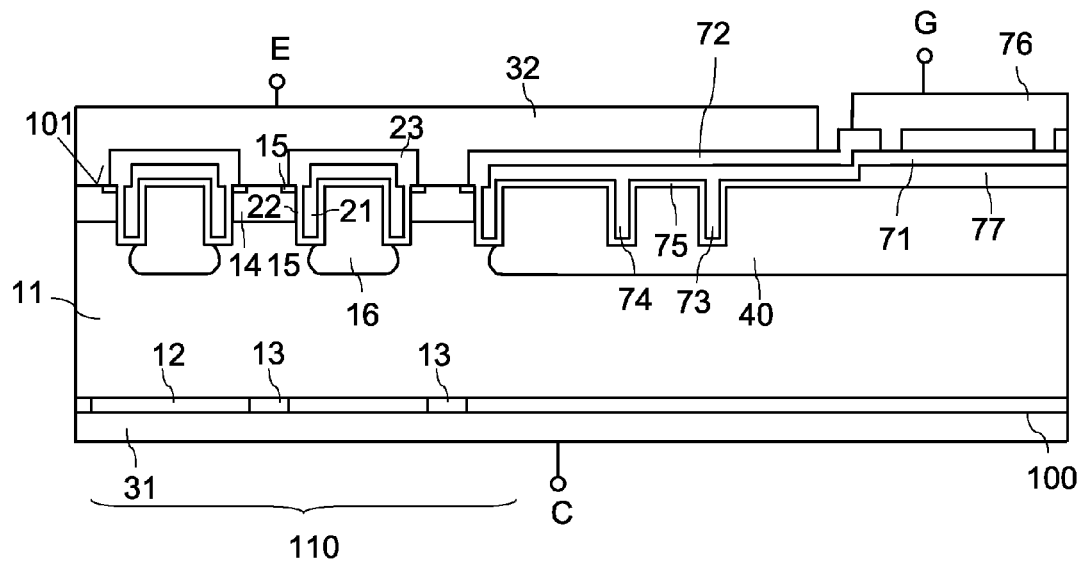
FIG. 10 illustrates a vertical cross sectional view of a semiconductor device according to a sixth embodiment.

FIG. 10 illustrates a semiconductor device that is a modification of the semiconductor device of FIG. 9. In the semiconductor device of FIG. 10 the first parasitic device region 40 extends to the trench of the edge transistor cell, so that the first parasitic region 40 is also present between the first and second trench electrodes 73, 74.

Figure 11:
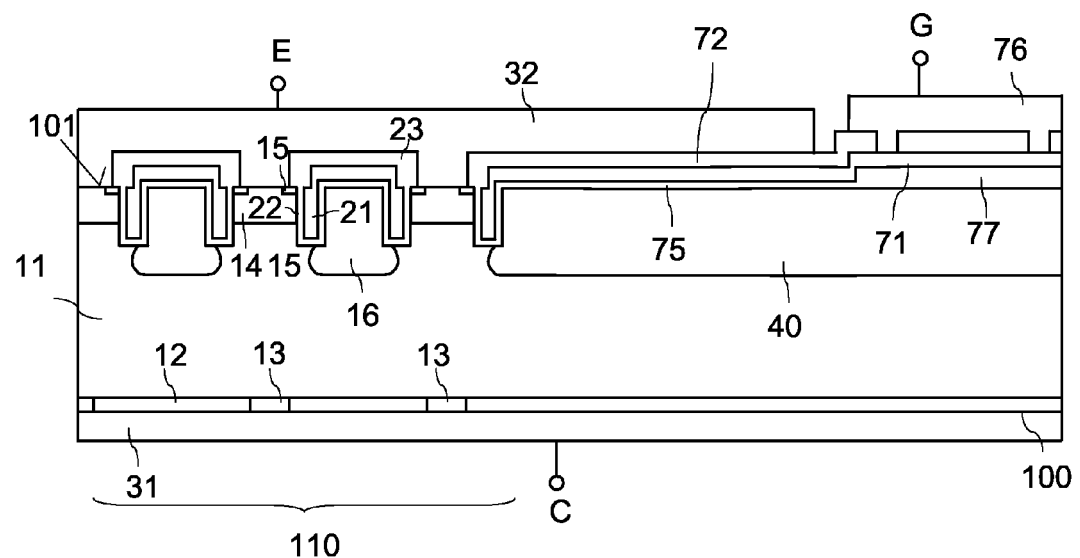
FIG. 11 illustrates a vertical cross sectional view of a semiconductor device according to a seventh embodiment.

Referring to FIG. 11, which illustrates a modification of the semiconductor device of FIG. 10, the first and second trench electrodes may be omitted. The first parasitic device region 40 may be electrically connected to the floating semiconductor region 16 in the cell region 110.

Figure 12:
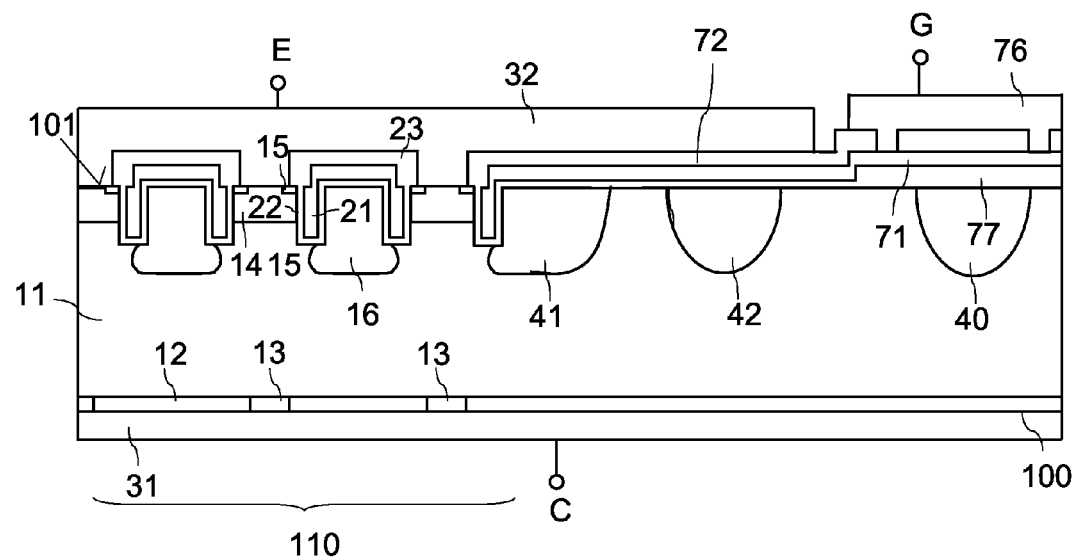
FIG. 12 illustrates a vertical cross sectional view of a semiconductor device according to an eighth embodiment.

FIG. 12 illustrates a modification of the semiconductor device of FIG. 11. In the semiconductor device of FIG. 12 several floating parasitic device regions of the first conductivity type are arranged in the drift region 11 outside the cell region 110 instead of only the first parasitic device region 40 illustrated in FIG. 11. Referring to FIG. 12, a first parasitic device region 40 is located below the gate pad or gate wire 71, a second parasitic device region 41 is distant to the first parasitic device region 40 in the horizontal direction of the semiconductor body 100 and adjoins the trench with the gate electrode 21 of the edge transistor cell. Further, a third parasitic device region 42 is arranged between the first and second parasitic device regions 40, 41 and is distant to each of these first and second parasitic device regions 40, 41. Each of the three parasitic device regions 40, 41, 42 adjoins the first surface 101 of the semiconductor body 100. The first parasitic device region 40 is below the gate pad or gate via 71, while the second and third parasitic device regions 41, 42 are below the planar conductor 72. According to one embodiment, the second parasitic device region 41 is electrically connected to the floating semiconductor regions 16 in the cell region 110.

Figure 13:
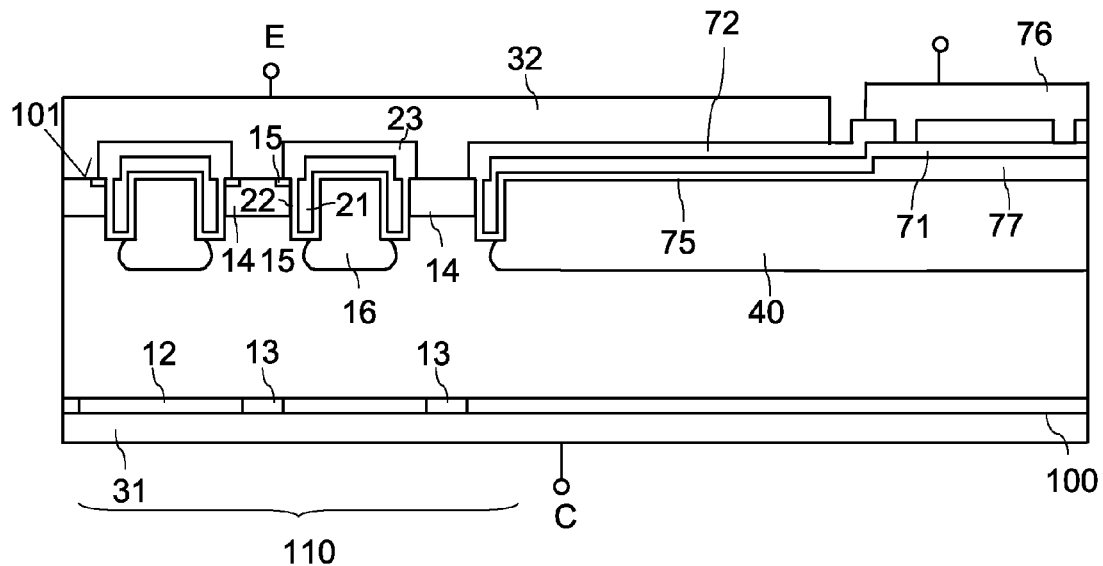
FIG. 13 illustrates a vertical cross sectional view of a semiconductor device according to a ninth embodiment.
Figure 14:
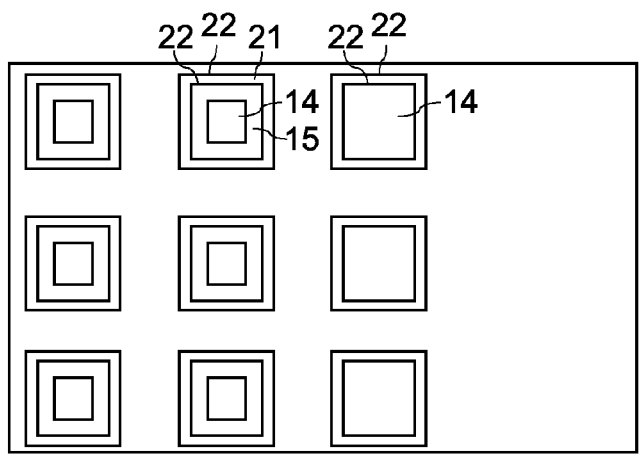
FIG. 14 illustrates a horizontal cross sectional view of a semiconductor device according to one embodiment.

In each of the embodiments explained with reference to FIGS. 6 and 9 to 12, the individual transistor cells are identical, so that the edge transistor cell corresponds to transistor cells distant to the edge of the cell region 110. According to one embodiment, that is illustrated in FIG. 13 the device cells at the edge of the cell region 110 may be modified so as to include a body region 14 electrically connected to the emitter electrode 32, but not a source region. FIG. 14 illustrates a horizontal cross sectional view of a section of the cell region 110 of this semiconductor device. Referring to FIG. 14, device cells at the edge of the cell region 110 do not include source regions 15. Referring to a further embodiment (not illustrated) not only those device cells located at the edge of the cell region 110, but also device cells adjoining the edge device cells may be implemented without a source region 15.

In the semiconductor device of FIG. 13, there is one parasitic device region 40 that corresponds to the parasitic device region 40 explained with reference to FIG. 11. However, this is only an example. Edge device cells without a source region 15 may be implemented in each of the semiconductor devices explained herein before.

In each of the semiconductor devices explained before, the floating parasitic semiconductor regions 40 in the edge region or below the gate pads or gate vias help to transport charge carriers from the edge region or from below the gate pads or gate vias to or into the cell region and, therefore, help to improve the voltage blocking capability in these regions.

In the above detailed description, directional terminology, such as "top", "bottom", "front", "back", "leading", "trailing", "under", "below", "lower", "over", "upper", etc., is used with reference to the orientation of the figures being described. Because components of embodiments can be positioned in a number of different orientations, the directional terminology is used for purposes of illustration and is in no way limiting. It is to be understood that the features of the various exemplary embodiments described herein may be combined with each other, unless specifically noted otherwise.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Other embodiments may be utilized and structural or logical changes may be made without departing from the scope of the present invention. The detailed description, therefore, is not to be taken in a limiting sense. Instead, the present invention is defined and limited only by the appended claims and their legal equivalents.

What is claimed is:

1. A method, comprising:
    operating a semiconductor transistor device in a reverse biased unipolar mode before operating the semiconductor transistor device in an off-state in a forward biased mode,
    wherein the semiconductor transistor device comprises:
        a first emitter region of a first conductivity type, a second emitter region of a second conductivity type complementary to the first conductivity type, and a drift region of the second conductivity type arranged in a semiconductor body;
        a first electrode, wherein the first emitter region and the second emitter region are arranged between the drift region and the first electrode and are each connected to the first electrode;
        a cell region comprising at least one device cell, the at least one device cell comprising a body region of the first conductivity type adjoining the drift region, a source region of the second conductivity type adjoining the body region, and a gate electrode adjacent the body region and dielectrically insulated from the body region by a gate dielectric;
        a second electrode electrically connected to the source region and the body region of the at least one device cell;
        at least one first parasitic region of the first conductivity type disposed outside the cell region; and
    wherein the at least one first parasitic region is floating,
    wherein the semiconductor transistor device is operated in the reverse biased unipolar mode by driving the gate electrode such that a conducting channel is generated in the body region between the source region and the drift region before the semiconductor transistor device is forward biased,
    wherein in the reverse biased unipolar mode, charge carriers of the second conductivity type bypass the body region and injection of charge carriers of the first conductivity type into the drift region is reduced such that a low concentration of charge carriers of the first conductivity type is injected into the drift region or only charge carriers of the second conductivity type are injected into the drift region in the reverse biased unipolar mode.

2. The method of claim 1, wherein operating the semiconductor transistor device in the reverse biased unipolar mode comprises:
    applying a voltage between the first electrode and the second electrode which forward biases a pn-junction between the body region and the drift region; and
    applying a drive potential to the gate electrode which causes an inversion channel in the body region between the source region and the drift region.

3. The method of claim 2, wherein operating the semiconductor transistor device in the off-state in the forward biased mode comprises:
    applying a voltage between the first electrode and the second electrode which reverse biases the pn-junction between the body region and the drift region; and
    applying a drive potential to the gate electrode which interrupts the inversion channel.

4. The method of claim 1, wherein the semiconductor transistor device further comprises:
    an edge termination structure, and
    wherein the at least one first parasitic region is part of the edge termination structure.

5. The method of claim 1, wherein the semiconductor transistor device further comprises:
    a gate pad or gate via electrically connected to the gate electrode, arranged above the semiconductor body and distant to the cell region, and
    wherein the at least one first parasitic region is at least partially arranged below the gate pad or gate via in the semiconductor body.

6. The method of claim 1, wherein the semiconductor transistor device further comprises:
    a second parasitic region distant to the at least one first parasitic region and outside the cell region.

7. The method of claim 6, wherein the second parasitic region adjoins the gate dielectric of at least one device cell.

8. The method of claim 1, wherein the semiconductor transistor device further comprises:
    at least one planar conductor arranged above the semiconductor body outside the cell region and electrically connected to the gate electrode.

9. The method of claim 8, wherein the semiconductor transistor device further comprises:
    an edge termination structure arranged outside the cell region, the edge termination structure comprising at least one field plate, and
    wherein the at least one planar conductor is further connected to the first field plate.

10. The method of claim 8, wherein the semiconductor transistor device further comprises:
    a gate pad or gate via arranged outside the cell region and above a first surface of the semiconductor body, and
    wherein the at least one planar conductor is further connected to the gate pad or gate via.

11. The method of claim 8, wherein the semiconductor transistor device further comprises:

a first trench electrode and a second trench electrode electrically connected to the planar conductor, each arranged in a trench and dielectrically insulated from the semiconductor body.

12. The method of claim 11, wherein the first and second trench electrodes surround the cell region.

13. The method of claim 11, wherein the at least one first parasitic region adjoins the trench with the first trench electrode.

14. The method of claim 11, wherein a section of the drift region extends to a first surface of the semiconductor body between the first and second trench electrodes.

15. The method of claim 11, wherein a section of the at least one first parasitic region extends to a first surface of the semiconductor body between the first and second trench electrodes.

16. The method of claim 1, wherein the semiconductor transistor device further comprises:
    a plurality of device cells; and
    a floating semiconductor region of the first conductivity type in the cell region between the individual device cells.

17. The method of claim 16, wherein the floating semiconductor region adjoins a first surface of the semiconductor body.

18. The method of claim 16,
    wherein the gate electrode of each device cell is arranged in a trench that surrounds the body region of the device cell, and
    wherein the gate electrodes of neighboring device cells are electrically connected through conductors arranged above the semiconductor body.

19. The method of claim 16, wherein the at least one first parasitic region is electrically connected to the floating semiconductor region.

20. The method of claim 16, wherein the semiconductor transistor device further comprises:
    a second parasitic region of the first conductivity type distant to the at least one first parasitic region, and
    wherein at least one of the first and second parasitic regions is electrically connected to the floating semiconductor region.

21. The method of claim 1, wherein the semiconductor transistor device further comprises:
    a plurality of device cells in the cell region; and
    an edge region of the cell region,
    wherein device cells along the edge region of the cell region do not comprise a source region.

22. The method of claim 1,
    wherein a length of the drift region is in a current flow direction, the current flow direction being a direction in which charge carriers flow through the drift region when the semiconductor transistor device is in an on-state, and
    wherein a distance between the at least one first parasitic region and the second emitter region in a direction perpendicular to the current flow direction corresponds to at least the length of the drift region.

* * * * *